(12) United States Patent
Lee et al.

(10) Patent No.: US 6,274,426 B1
(45) Date of Patent: Aug. 14, 2001

(54) SELF-ALIGNED CONTACT PROCESS FOR A CROWN SHAPED DYNAMIC RANDOM ACCESS MEMORY CAPACITOR STRUCTURE

(75) Inventors: Yu-Hua Lee, Hsinchu; James (Cheng-Ming) Wu, Kao-Hsiung; Min-Hsiung Chiang, Taipei, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/257,830

(22) Filed: Feb. 25, 1999

(51) Int. Cl.⁷ .............................................. H01L 21/8242
(52) U.S. Cl. ......................... 438/253; 438/396; 438/639
(58) Field of Search ................................... 438/253, 254, 438/255, 256, 396, 397, 398, 399, 639

(56) References Cited

U.S. PATENT DOCUMENTS

| | | | |
|---|---|---|---|
| 5,482,894 | * 1/1996 | Havemann | 438/623 |
| 5,643,833 | * 7/1997 | Tsukamoto | 438/636 |
| 5,721,154 | * 2/1998 | Jeng | 438/253 |
| 5,723,374 | * 3/1998 | Huang et al. | 438/253 |
| 5,736,441 | 4/1998 | Chen | 438/255 |
| 5,763,306 | * 6/1998 | Tsai | 438/255 |
| 5,780,338 | 7/1998 | Jeng et al. | 438/253 |
| 5,792,689 | 8/1998 | Yang et al. | 438/253 |

* cited by examiner

Primary Examiner—Stephen D. Meier
Assistant Examiner—Toniae M. Thomas
(74) Attorney, Agent, or Firm—George O. Saile; Stephen B. Ackerman (57) ABSTRACT

A process for fabricating a crown shaped, capacitor structure, in a SAC opening, featuring a silicon nitride spacer, located on the walls of a bottom portion of the SAC opening, has been developed. The process features forming a SAC opening in a thick silicon oxide layer, then repairing, or filling, seams or voids, that may be present in the thick silicon oxide layer, at the perimeter of the SAC opening, via formation of a silicon nitride spacer on the sides of the SAC opening. Subsequent processing features: the isotropic removal of a top portion of the silicon nitride spacer; the formation of a polysilicon storage node structure, in the SAC opening; and the recessing of a top portion of the thick silicon oxide layer, resulting in exposure of additional polysilicon storage node, surface area.

9 Claims, 7 Drawing Sheets

SELF-ALIGNED CONTACT PROCESS FOR A CROWN SHAPED DYNAMIC RANDOM ACCESS MEMORY CAPACITOR STRUCTURE

BACKGROUND OF THE INVENTION (1) Field of the Invention

The present invention relates to methods used to fabricate semiconductor devices, and more specifically to a method used to create a self-aligned contact opening, for a capacitor structure.

(2) Description of Prior Art

The advent of the self-aligned contact, (SAC), opening, has contributed to the objective of increasing the density of semiconductor chips. The SAC opening, as used with metal oxide semiconductor field effect transistors, (MOSFET), allows the entire width of a source/drain region, located between gate structures, to be exposed, and to be subsequently contacted by an overlying conductive structure. The SAC opening comprises the exposure of the entire source/drain region, located in the space between gate structures, as well as the exposure of a portion of insulator capped, gate structures. Thus the SAC opening eliminates the need to form a fully landed contact hole to the source/drain region, and thus allows the space between the gate structures, to be less than the minimum photolithographic feature used, resulting in increased device density. The use of a SAC opening is made possible via use a reactive ion etching, (RIE), procedure, featuring a high etch rate ratio, or selectivity, between a silicon oxide layer, located between, as well as overlying, the insulator capped, gate structures, and the silicon nitride, or silicon oxynitride layer, used for the hard mask, or capping layer. However difficulties can be encountered earlier, when depositing the silicon oxide layer, in the high aspect ratio space between the insulator capped, gate structures. Undesirable seams or voids, can form at the point where the silicon oxide layers, on the sides of the insulator capped, gate structures, converge. The subsequent SAC opening will expose the seam or void, at the perimeter of the SAC opening, presenting a possible leakage or shorting mechanism, between the conductive structure formed in the SAC opening, and adjacent conductive structures.

This invention will provide a process in which the seam or void, in the silicon oxide layer, is repaired by forming a silicon nitride liner on the exposed sides of the silicon oxide layer, at the perimeter of the SAC opening. In addition this invention will provide a process used to recess back a top portion of the silicon nitride liner, however still leaving a bottom portion of the silicon nitride liner to protect the voids or seams in the portion of the silicon oxide layer located between the gate structures. This in turn allows a top portion of the silicon oxide layer to be recessed via a selective wet etch procedure, after the formation of a polysilicon storage node structure on the inside walls of the SAC opening, resulting in the additional exposure of polysilicon storage node surface, and thus increased capacitance for a crown shaped capacitor structure, located in the SAC opening. Prior art, such as Yang et al, in U.S. Pat. No. 5,792,689, as well as Chen, in U.S. Pat. No. 5,736,441, describe crown shaped capacitors, in SAC openings, however neither prior art describe the process for forming a silicon nitride liner, on the sides of the SAC opening, located between gate structures.

SUMMARY OF THE INVENTION

It is an object of this invention to create a crown shaped, capacitor structure, in a SAC opening.

It is another object of this invention to form a silicon nitride liner, on the inside walls of the SAC opening, formed in a silicon oxide layer, to repair voids or seams in the silicon oxide layer, now exposed at the perimeter of the SAC opening.

It is still another object of this invention to remove the top portion of the silicon nitride liner from the walls of a top portion of the SAC opening, to allow a polysilicon storage node structure to interface a silicon oxide layer, in top portion of the SAC opening, while allowing the polysilicon storage node structure to reside on the silicon nitride liner, in the bottom portion of the SAC opening.

It is still yet another object of this invention to recess a top portion of the silicon oxide layer, to expose a portion of the outside surfaces of the polysilicon storage node structure, creating a crown shaped, polysilicon storage node structure.

In accordance with the present invention a process for fabricating a crown shaped, capacitor structure, in a SAC opening, formed in a silicon oxide layer, and featuring a silicon nitride liner, used on the walls of the silicon oxide layer, exposed in the bottom portion of the SAC opening, is described. After creation of a source/drain region, in a semiconductor substrate, formed in the space between insulator capped, gate structures, and comprised with silicon nitride spacers, a thick silicon oxide layer is deposited. A SAC opening is formed in the thick silicon oxide layer, exposing the source/drain region, located between insulator capped, gate structures, and exposing a portion of the top surface of the insulator capped, gate structures. A thin silicon nitride liner is formed on the sides of the SAC opening. An organic plug is formed in the bottom portion of the SAC opening, allowing an isotropic etching procedure to remove the exposed portion of silicon nitride liner, from the sides of the top portion of the SAC opening. After formation of a polysilicon storage node structure, on the exposed inside surfaces of the SAC opening, the thick silicon oxide layer is recessed, resulting in a crown shaped, polysilicon storage node structure comprised of: upper polysilicon features, extending upwards from the bottom portion of the thick silicon oxide layer; lower polysilicon features, located on the sides of the bottom portion of the thick silicon oxide layer, in the SAC opening; and comprised of a horizontal polysilicon feature, located at the bottom of the SAC opening, overlying the source/drain region, and connecting the vertical polysilicon features, located on the sides of the SAC opening. After formation of a capacitor dielectric layer, on the exposed surfaces of the polysilicon storage node structure, a polysilicon upper, or cell plate is formed, resulting in a crown shaped capacitor structure, in a SAC opening, with the bottom portion of the polysilicon storage node structure, of the crown shaped capacitor structure, interfacing a silicon nitride liner, which in turn was formed on the sides of the bottom portion of the SAC opening.

BRIEF DESCRIPTION OF THE DRAWINGS

The object and other advantages of this invention are best described in the preferred embodiment with reference to the attached drawings that include.

DESCRIPTION OF THE PREFERRED EMBODIMENTS

The method of fabricating a crown shaped capacitor structure, in a SAC opening, featuring a silicon nitride liner, located on the walls of a lower segment of the SAC opening, will now be described in detail. This invention is described using a dynamic random access memory, (DRAM), capacitor structure, in the silicon nitride lined, SAC opening. However the silicon nitride lined SAC opening, can be used to accommodate other conductive structures, such as polysilicon, or refractory, (tungsten), metal plug structures, used for either interconnect structures, or as a component of bit line, or capacitor structure.

Figure 1:
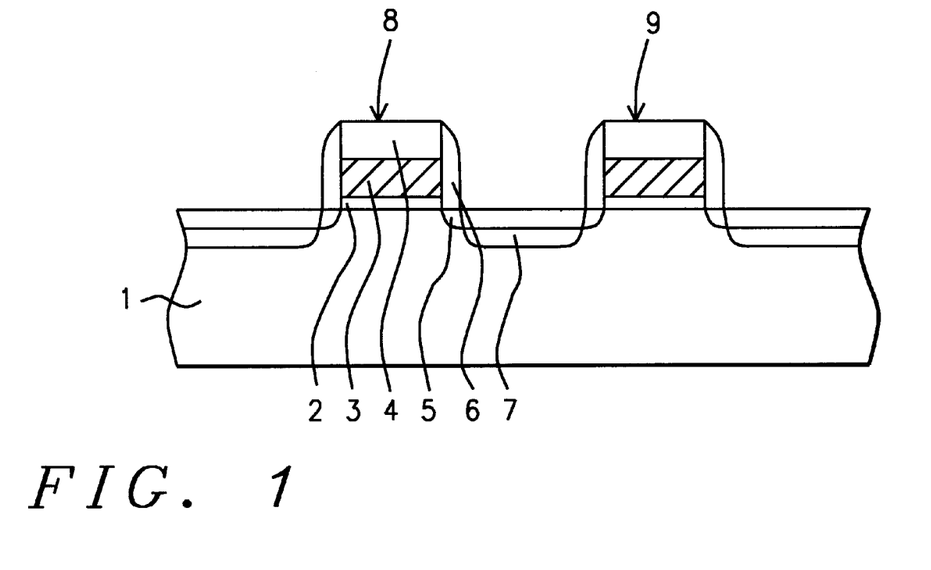
FIGS. 1, 2B, 3B, 4, 5B, 6, 7, 8, and 9B, which schematically, in cross-sectional style, show the key stages of fabrication, used to create a crown shaped capacitor structure, in a SAC opening that is comprised with a silicon nitride liner, formed on the walls of the SAC opening.

A P type, semiconductor substrate 1, comprised of single crystalline silicon, with a <100> crystallographic orientation, is used and schematically shown in FIG. 1. After formation of isolation regions, (not shown in the drawings), such as thermally grown, field oxide, (FOX), regions, or insulator filled shallow trenches, a gate insulator layer 2, comprised of silicon dioxide, is thermally grown to a thickness between about 50 to 100 Angstroms. A polysilicon layer 3, is next deposited via low pressure chemical vapor deposition, (LPCVD), procedures, at a thickness between about 500 to 3000 Angstroms. Polysilicon layer 3, can be doped in situ, during deposition, via the addition of arsine, or phosphine, to a silane ambient, or polysilicon layer 3, can be deposited intrinsically, then doped via an ion implantation procedure, using arsenic, or phosphorous ions. If desired a polycide layer can be used in place of polysilicon layer 3, with the polycide layer comprised of an overlying metal silicide layer, such as tungsten silicide, and an underlying layer of polysilicon. Insulator layer 4, used as a hard mask or capping layer, comprised of either silicon nitride, or of silicon oxynitride, is then deposited via LPCVD or plasma enhanced chemical vapor deposition, (PECVD), procedures, to a thickness between about 1000 to 3000 Angstroms. Conventional photolithographic and reactive ion etching, (RIE), procedures, using $CF_4/CHF_3$ as an etchant for insulator layer 4, and using $Cl_2$ as an etchant for polysilicon layer 3, are employed to create insulator capped, gate structures 8 and 9, schematically shown in FIG. 1

After removal of the masking photoresist shapes, used for definition of the insulator capped, gate structures, via plasma oxygen ashing and careful wet cleans, lightly doped source/drain region 5, is formed via ion implantation of arsenic or phosphorous ions, at an energy between about 20 to 50 KeV, at a dose between about 1E13 to 1E14 atoms/$cm^2$. Silicon nitride spacers 6, are next formed on the sides of the insulator capped, gate structures, accomplished via the deposition of a silicon nitride layer, at a thickness between about 500 to 2000 Angstroms, using either LPCVD or PECVD procedures, then followed by an anisotropic RIE procedure, using $CF_4/CHF_3$ as an etchant. Heavily doped source/drain region 7, shown schematically in FIG. 1, is then formed via ion implantation of arsenic or phosphorous ions, at an energy between about 20 to 50 KeV, at a dose between about 1E14 to 1E16 atoms/$cm^2$.

Figure 2A:
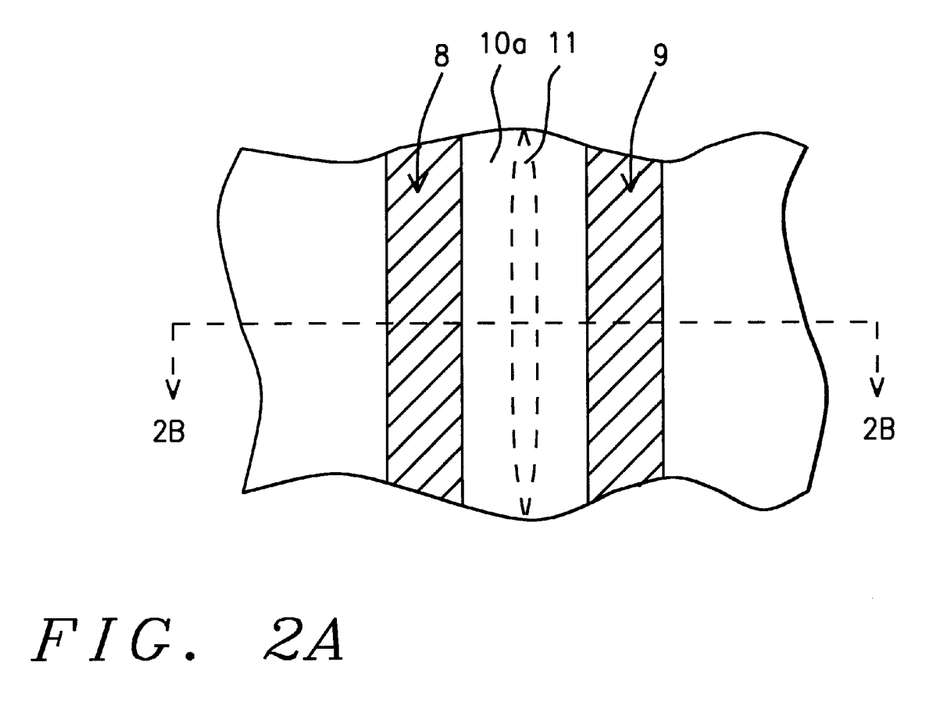
FIGS. 2A, 3A, 5A, and 9A, which schematically show the top view of the crown shaped capacitor structure, in the SAC opening, at key stages of the fabrication process.
Figure 2B:
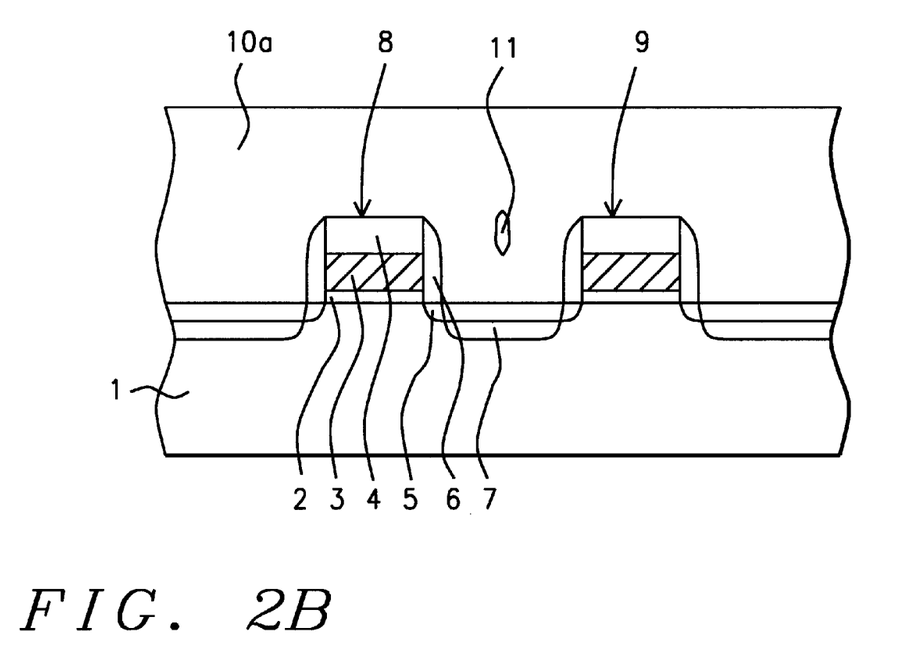

A thick silicon oxide layer 10a, is next deposited, via LPCVD, PECVD, or high density plasma chemical vapor deposition, (HDPCVD), procedures, to a thickness between about 5000 to 10000 Angstroms, at a temperature between about 690 to 780° C., using tetraethylorthosilicate, (TEOS), as a source. Thick silicon oxide layer 10a, shown schematically in FIG. 2B, fills the narrow space between the insulator filled, gate structures, as well as overlying the insulator capped, gate structures. A chemical mechanical polishing, (CMP), procedure, is used for planarization purposes, resulting in a smooth top surface topography for thick silicon oxide layer 10a. The mechanism of filling the narrow space between the insulator capped, gate structures is the deposition of silicon oxide layer 10a, on the walls of the gate structures. The filling of the narrow space is complete when the silicon oxide layers, formed on the walls of the insulator capped, gate structures, converge. However if a high aspect ratio, comprised of thick, insulator capped gate structures, and of a narrow space, exists, the converging silicon oxide layers, obtained via a TEOS, LPCVD or PECVD procedure, can result in an unwanted seam, or a void, being present at the point of convergence, located between the insulator capped, gate structures. The seam or void 11, is shown schematically, in cross-sectional style, in FIG. 2B, and shown schematically, in a top view, in FIG. 2A.

Figure 3A:
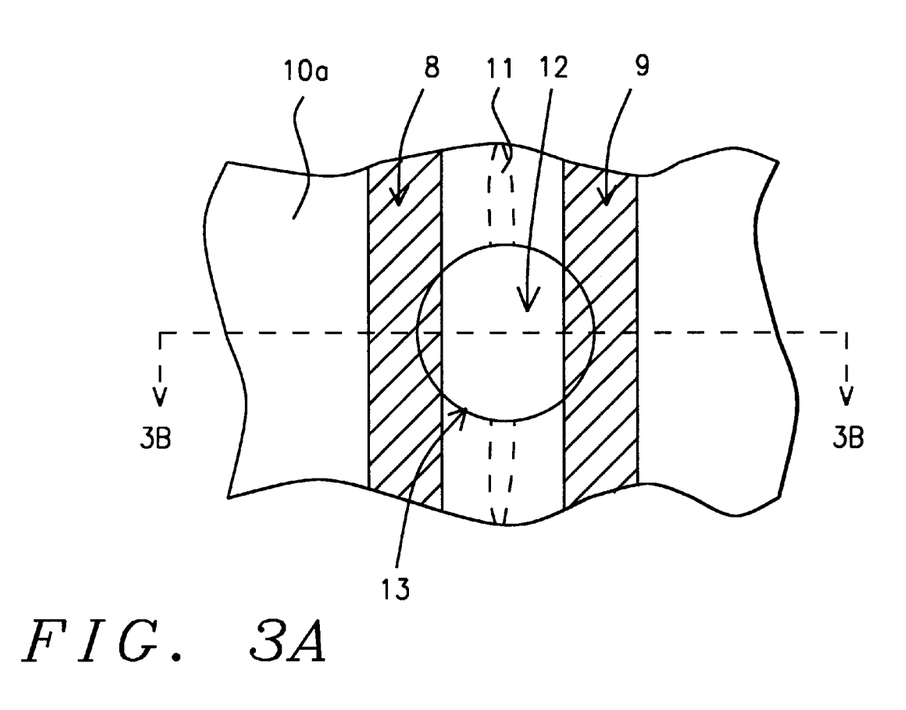
Figure 3B:
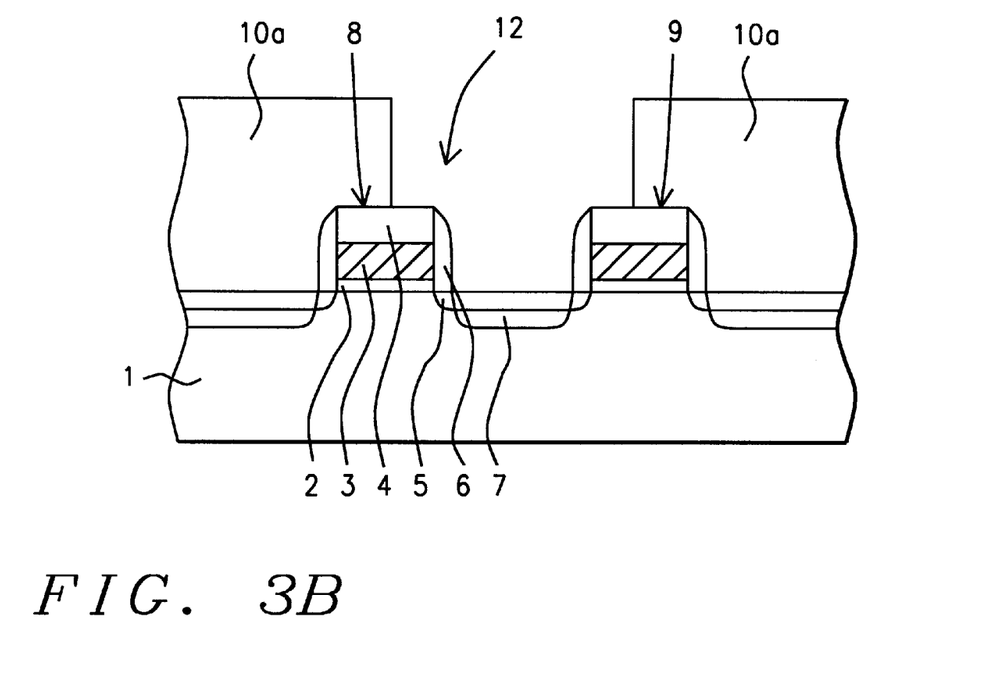

A self-aligned contact, (SAC), opening 12, is next addressed, and shown schematically in FIGS. 3A and 3B. If the space between the insulator capped, gate structures, is narrower than the minimum photolithographic feature available, a fully landed contact hole, to the heavily doped source/drain region 7, can not be achieved via conventional procedures. Therefore the SAC concept, comprised with an opening larger in width, than the space between insulator capped, gate structures, is used. SAC opening 12, shown schematically in FIG. 3B, is obtained via conventional photolithographic procedures, and a selective, RIE procedure, using $CHF_3$ as an etchant for thick silicon oxide layer 10a. The etch rate ratio of silicon oxide, to either silicon nitride or silicon oxynitride, is between about 10 to 1, allowing the SAC opening, RIE procedure, to completely remove thick silicon oxide layer 10a, from the narrow space between insulator capped, gate structures, while slowing, or stopping on the capping insulator layer 5, comprised of silicon nitride or silicon oxynitride. However SAC opening 12, now exposes seam or void 11, at the perimeter, or edge 13, of SAC opening 12. This is schematically shown in FIG. 3A. Subsequent deposition of a conductive layer, in SAC opening 12, can also deposit in seam or void 12, resulting in possible leakage or shorting path between the conductive structure, in SAC opening 12, and adjacent conductive structures.

Figure 4:
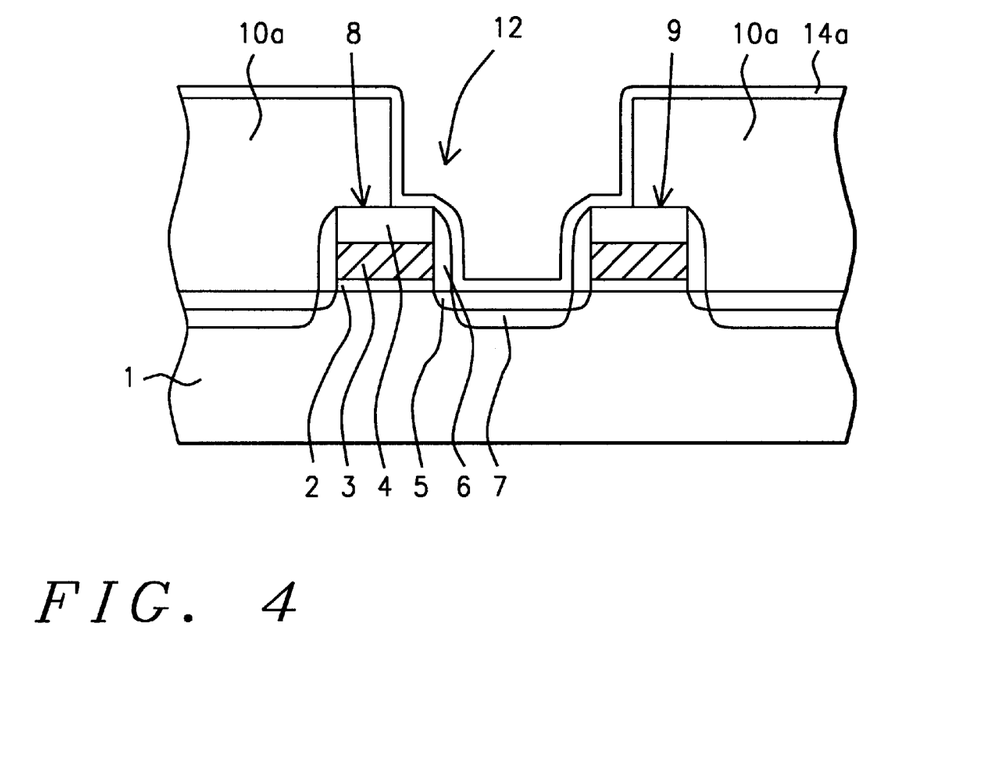
Figure 5A:
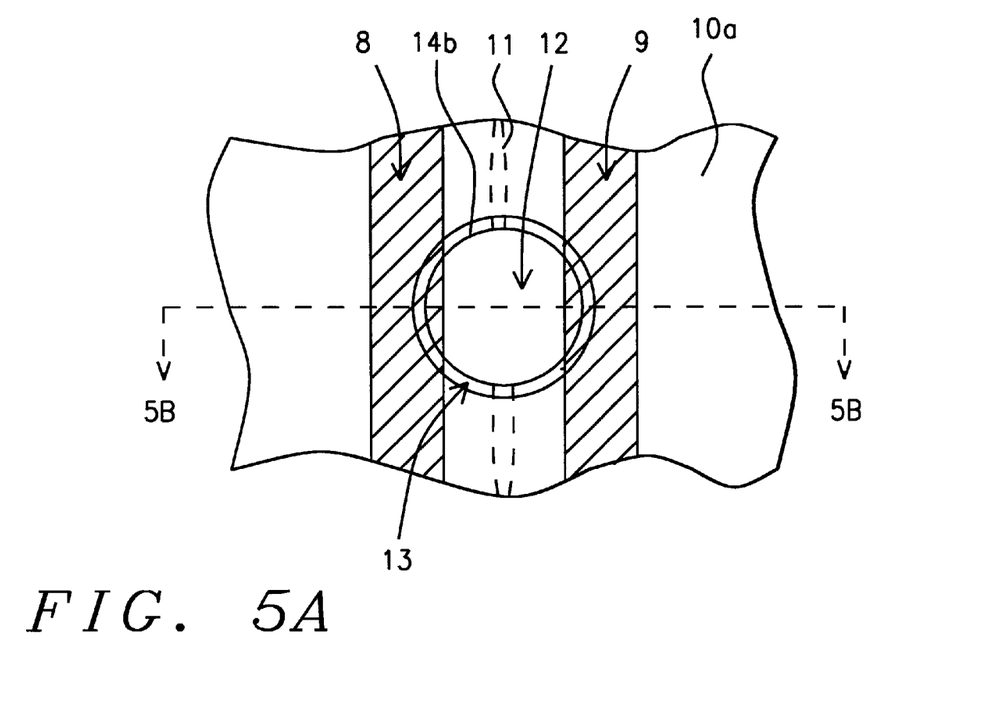
Figure 5B:
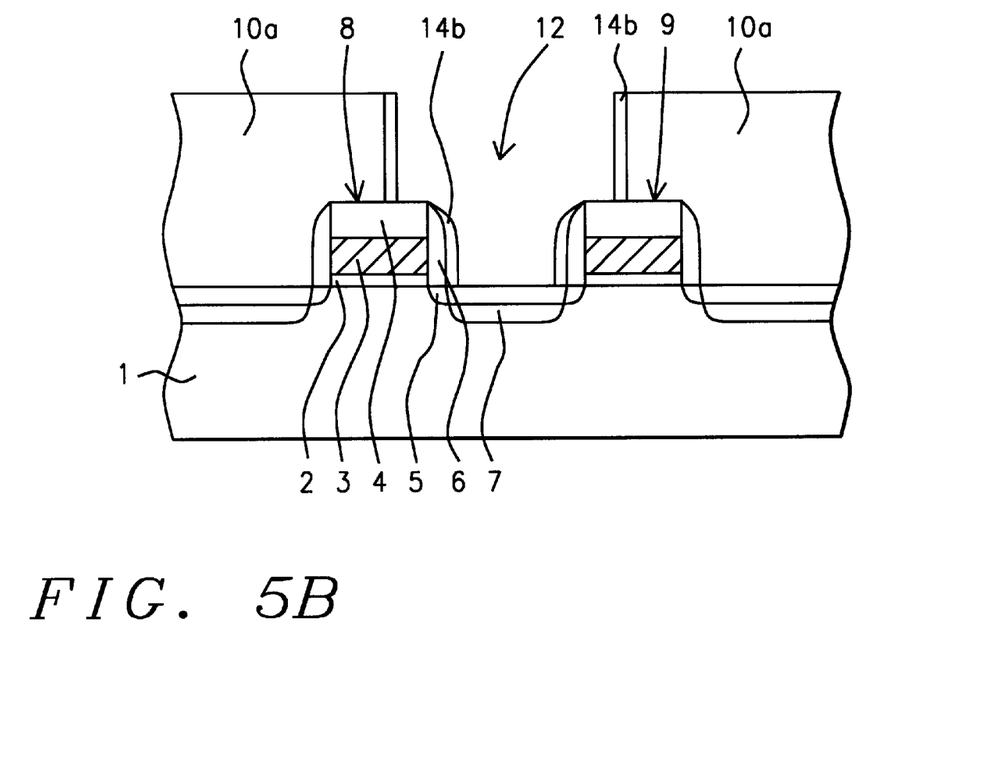

A process for repairing the unwanted seam or void 11, in thick silicon oxide layer 10a, at the perimeter of SAC opening 12, is next addressed. After removal of the photoresist shape, used as a mask for definition of SAC opening 12, via plasma oxygen ashing and careful wet cleans, silicon nitride layer 14a, is deposited via LPCVD or PECVD procedures, at a thickness between about 50 to 200 Angstroms, Silicon nitride layer 14a, shown schematically in FIG. 4, conformally deposits on all exposed surfaces, including filling, or repairing, seam or void 11, in thick silicon oxide layer 10a. An anisotropic RIE procedure, using $CF_4/CHF_3$ as an etchant, is used to remove regions of silicon nitride layer 14a, from the top surface of thick silicon oxide layer 10a, and from the top surface of heavily source/drain region 7, resulting in silicon nitride spacers 14b, on the sides of thick silicon oxide layer 10a, exposed in SAC opening 12. This is shown schematically, in cross-sectional style, in FIG. 5B, while a top view, schematically shown in FIG. 5A, shows silicon nitride spacer 14b, repairing seam 11, at edge 13, in SAC opening 12.

Figure 6:
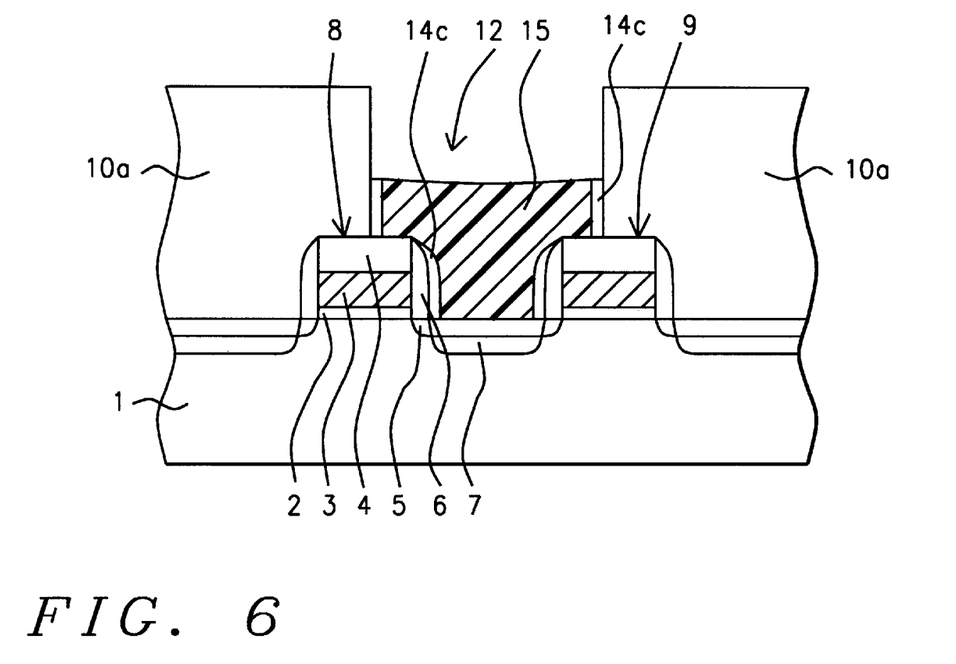

At this point of the process a conductive structure can be placed in the silicon nitride lined, SAC opening, with the seam, or voids, in the thick silicon oxide layer, repaired by the silicon nitride spacers. However if a crown shaped capacitor structure is the desired conductive structure, to be formed in the SAC opening, silicon nitride spacers 14b, used to repair seams or voids in thick silicon oxide layer 12, can interfere with the subsequent construction of the crown shaped capacitor structure, in SAC opening 12. To obtain the desired crown shaped structure, thick silicon oxide layer 10a, has to be etched back, or recessed, after the formation of a polysilicon storage node structure, on the inside walls of SAC opening 12, to expose additional surface area of the polysilicon storage node structure. However silicon nitride spacers 14b, if not addressed, would still be present on the outside surface of the polysilicon storage node structure, after the recessing of thick silicon oxide layer 10a, thus preventing the additional surface of the polysilicon storage node structure to be realized. Therefore a procedure to remove a top portion of silicon nitride spacers 14b, is employed, and described schematically using FIG. 6. A photoresist layer, or a bottom anti-reflective coating, (BARC), layer, such as a polyimide, non-photosensitive organic material, is applied, completely filling SAC opening 12. A top portion of the photoresist, or BARC layer, is removed via exposure/development procedures, or via an oxygen, dry etch procedure, resulting in organic plug layer 15, located in a bottom portion of SAC opening 12. An isotropic dry etch procedure, using $CF_4/CHF_3$ as an etchant, is then used to remove exposed portions of silicon nitride spacers 14b, resulting in silicon nitride spacers 14c, still protected by organic plug 15. Silicon nitride spacers 14c, schematically shown in FIG. 6, still remain in place to repair the seam or voids in thick silicon oxide layer 10a, but now allow the desired recessing of thick silicon oxide layer 10a, to be performed. Organic plug 15, is removed via plasma oxygen ashing and careful wet clean.

Figure 7:
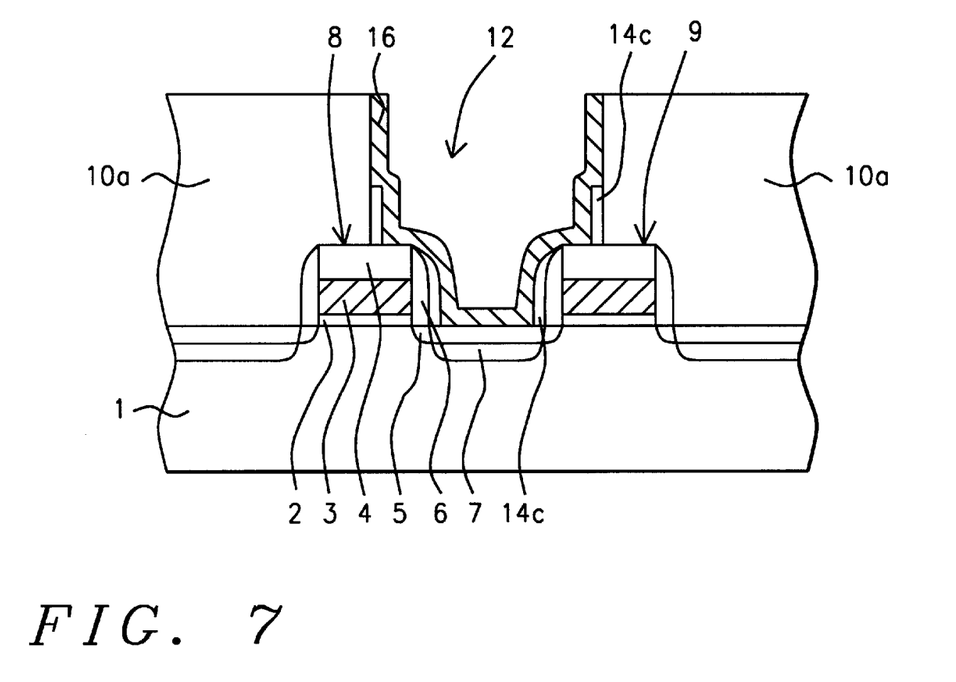
Figure 8:
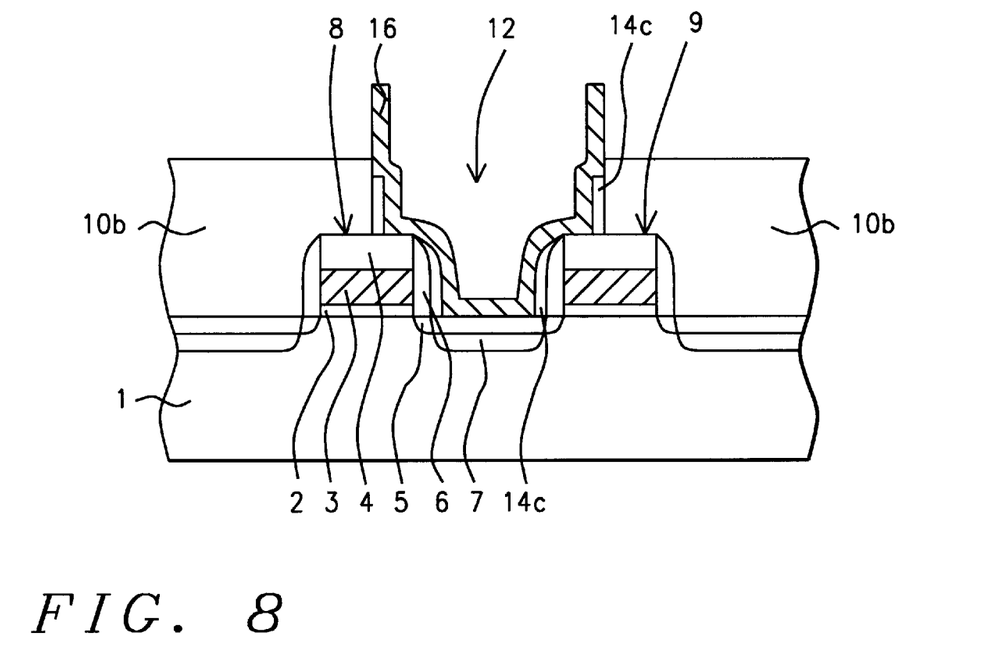

Polysilicon storage node structure 16, shown schematically in FIG. 7, is next formed. A polysilicon layer is obtained via LPCVD procedures, at a thickness between about 300 to 1000 Angstroms, and doped in situ, during deposition, via the addition of arsine, or phosphine, to a silane ambient. A chemical mechanical polishing, (CMP), procedure, is used to remove the region of the polysilicon layer, located on the top surface of thick silicon oxide layer 10a, resulting in the creation of polysilicon storage node structure 16. A selective etch procedure, such as a RIE procedure, using $CHF_3$ as an etchant, or a wet etch procedure, using a buffered hydrofluoric acid solution, is used to remove a top portion of thick silicon oxide layer 10a, resulting in a thinner, silicon oxide layer 10b, now between about 1000 to 5000 Angstroms in thickness. The recessing of thick silicon oxide layer 10a, exposes additional surface area of polysilicon storage node structure 16, shown schematically in FIG. 8, resulting in the desired crown shape, and thus allowing the subsequent crown shaped capacitor structure, providing increased capacitance, to be realized.

Figure 9A:
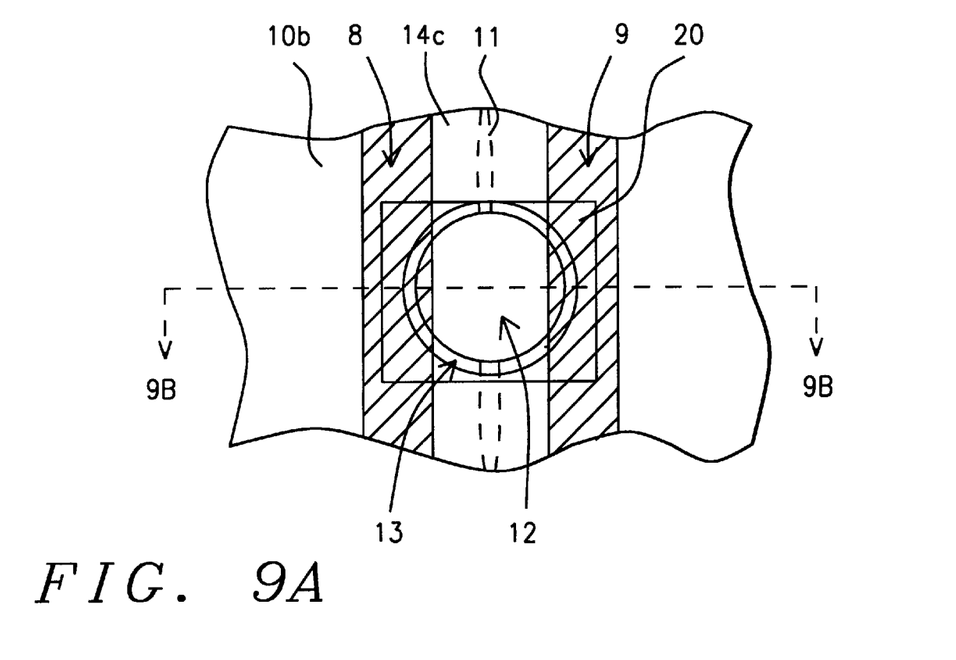
Figure 9B:
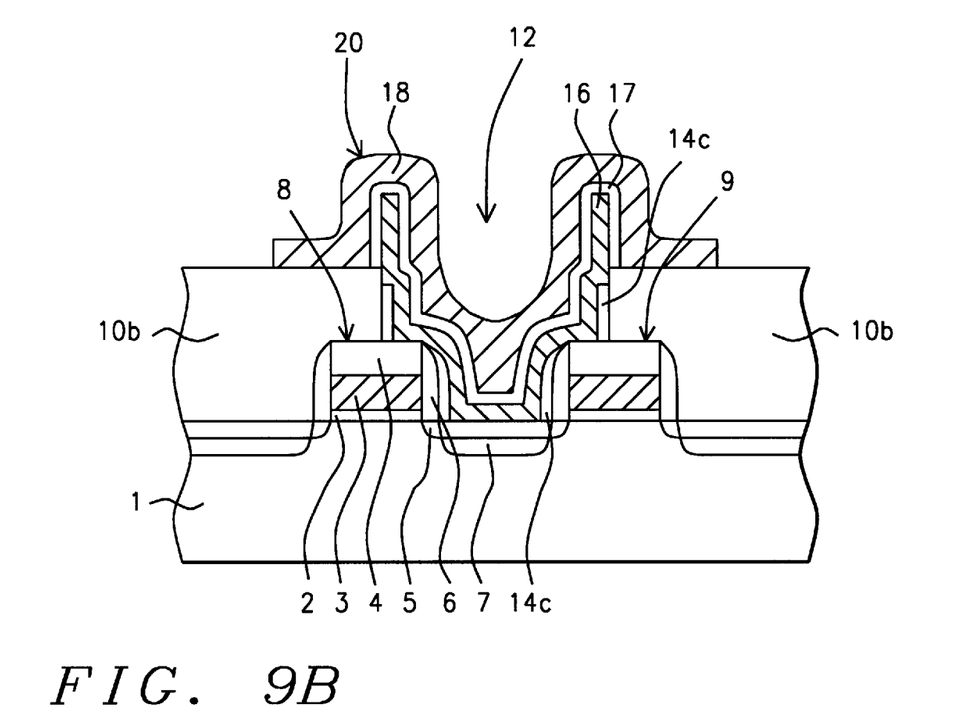

FIGS. 9A and 9B, schematically show a final stage of fabrication for the crown shaped capacitor structure. A capacitor dielectric layer 17, such as ONO, (oxidized nitride on Oxide), or tantalum oxide, featuring a high dielectric constant, is formed at an equivalent silicon oxide thickness, between about 30 to 50 Angstroms, on all exposed surfaces of polysilicon storage node structure 16. Next a polysilicon layer is deposited, via LPCVD procedures, at a thickness between about 500 to 2000 Angstroms, doped in situ, during deposition, via the addition of arsine, or phosphine, to a silane ambient. Conventional photolithographic and RIE procedures, using $Cl_2$ as an etchant, are used to pattern the polysilicon layer, resulting in the definition of upper polysilicon structure, or cell plate 18, shown schematically in cross-sectional style in FIG. 9B. The crown shaped capacitor structure 20, comprised of cell plate 18, capacitor dielectric layer 17, and polysilicon storage node structure 16, located in SAC opening 12, is shown schematically in FIG. 9B. The top view of crown shaped capacitor structure 20, shown in FIG. 9A, again shows silicon nitride spacers 14c, separating, or isolating, crown shaped capacitor structure 20, from the seam or voids in silicon oxide layer 10b. The photoresist shape, used for definition of polysilicon cell plate 18, is again removed via plasma oxygen ashing and careful wet cleans.

While this invention has been particularly shown and described with reference to, the preferred embodiments thereof, it will be understood by those skilled in the art that various changes in form and details amy be made without departing from the spirit and scope of this invention.

What is claimed is:

1. A method of fabricating a crown shaped, capacitor structure, in a SAC opening, on a semiconductor substrate, wherein the bottom portion of the SAC opening is lined with a silicon nitride spacer, comprising the steps of:

providing insulator capped, gate structures, on a gate insulator layer, with insulator spacers on the sides of said insulator capped, gate structures, and with a source/drain region located in an area of said semiconductor substrate, not covered by said insulator capped, gate structures, or by said insulator spacers;

depositing a thick silicon oxide layer;

forming said SAC opening, in said thick silicon oxide layer, with the width of said SAC opening larger than the space between said insulator capped, gate structures, exposing a source/drain region, located between said insulator capped, gate structures, and exposing a top portion of said insulator capped, gate structures;

depositing a silicon nitride layer;

performing an anisotropic dry etch procedure to create a first silicon nitride spacer, on the sides of said SAC opening;

forming an organic plug, in the bottom portion of said SAC opening;

performing an isotropic etch procedure to remove a top portion of said first silicon nitride spacer from the region of said SAC opening, not filled with said organic plug, creating a second silicon nitride spacer, on the sides of said bottom portion of said SAC opening;

forming a polysilicon storage node structure, with said polysilicon storage node structure interfacing said thick silicon oxide layer, in a top portion of said SAC opening, and interfacing said second silicon nitride spacer, in said bottom portion of said SAC opening;

removing a top portion of said thick silicon oxide layer, resulting in a crown shaped, polysilicon storage node structure, comprised of a top portion of said polysilicon storage node structure, extending upwards from a bottom portion of said thick silicon oxide layer, and a bottom portion of said polysilicon storage node structure, interfacing said second silicon nitride spacer, in said bottom portion of said SAC opening, forming a capacitor dielectric layer, on said crown shaped, polysilicon storage node structure; and forming a polysilicon cell plate structure, on said capacitor dielectric layer, resulting in said crown shaped, capacitor structure, located in said SAC opening.

2. The method of claim 1, wherein the capping layer, of said insulator capped, gate structures, is either a silicon nitride layer, or a silicon oxynitride layer, each deposited via LPCVD or PECVD procedures, to a thickness between about 1000 to 3000 Angstroms.

3. The method of claim 1, wherein said thick silicon oxide layer is obtained, at a thickness between about 5000 to 10000 Angstroms, via an LPCVD, PECVD, or HDPCVD procedure, at a temperature between about 690 to 780° C., using TEOS as a source.

4. The method of claim 1, wherein said SAC opening is formed in said thick silicon oxide layer, via an anisotropic RIE procedure, using $CHF_3$ as an etchant, and with an etch rate ratio of silicon oxide, to either silicon nitride, or silicon oxynitride, of about 10 to 1.

5. The method of claim 1, wherein said first silicon nitride spacer is formed via deposition of a silicon nitride layer, via LPCVD or PECVD procedures, at a thickness between about 50 to 200 Angstroms, followed by an anisotropic RIE procedure, using $CF_4/CHF_3$ as an etchant.

6. The method of claim 1, wherein said organic plug, located at the bottom of said SAC opening, can be comprised of a bottom anti-reflective coating, (BARC), layer, such as polyimide, or comprised of a photoresist material, and formed via application of the organic material, followed by the removal of the unwanted organic material, via an oxygen dry etch procedure, or via an exposure/development procedure.

7. The method of claim 1, wherein said second silicon nitride spacer is formed via an isotropic etch procedure, applied to exposed regions of said first silicon nitride spacer, using $CF_4/CHF_3$ as an etchant.

8. The method of claim 1, wherein said polysilicon storage node structure is formed via an LPCVD deposition of an in situ doped polysilicon layer, to a thickness between about 300 to 1000 Angstroms, followed by the removal of regions of the polysilicon layer, from the top surface of said thick silicon oxide layer, via a chemical mechanical polishing, (CMP), procedure.

9. The method of claim 1, wherein the removal of a top portion of said thick silicon oxide layer, is performed via a RIE procedure, using $CHF_3$ as an etchant, or performed using a buffered hydrofluoric acid solution.

* * * * *